United States Patent [19]
Fukuda et al.

[11] Patent Number: 5,288,948
[45] Date of Patent: Feb. 22, 1994

[54] STRUCTURE OF A SEMICONDUCTOR CHIP HAVING A CONDUCTIVE LAYER

[75] Inventors: Yasuhiro Fukuda; Tetsuhiko Sugahara; Norio Hirashita; Mitsuhiro Matsuo; Minoru Saito; Masayuki Kobayakawa; Fumitaka Yokoyama, all of Tokyo, Japan

[73] Assignee: Oki Electric Industry Co., Ltd., Tokyo, Japan

[21] Appl. No.: 778,881
[22] PCT Filed: Mar. 29, 1990
[86] PCT No.: PCT/JP90/00424
  § 371 Date: Dec. 26, 1991
  § 102(e) Date: Dec. 26, 1991
[87] PCT Pub. No.: WO91/00616
  PCT Pub. Date: Jan. 10, 1991

[30] Foreign Application Priority Data

Jun. 26, 1989 [JP] Japan ................ 1-160926
  Oct. 16, 1989 [JP] Japan ................ 1-119669[U]

[51] Int. Cl.⁵ .............................. H05K 1/00
[52] U.S. Cl. ............................ 174/250; 257/775
[58] Field of Search ............ 357/71; 174/250, 268; 361/410; 257/747, 749, 750, 774, 775, 776

[56] References Cited
FOREIGN PATENT DOCUMENTS

| | | |
|---|---|---|
| 62-269331 | 11/1986 | Japan . |
| 61-269332 | 11/1986 | Japan . |
| 61-269333 | 11/1986 | Japan . |
| 62-45147 | 2/1987 | Japan . |
| 62-45149 | 2/1987 | Japan . |
| 62-45150 | 2/1987 | Japan . |
| 62-111451 | 5/1987 | Japan . |
| 62-111452 | 5/1987 | Japan . |
| 62-111453 | 5/1987 | Japan . |
| 62-202523 | 9/1987 | Japan . |
| 62-202524 | 9/1987 | Japan . |
| 62-202525 | 9/1987 | Japan . |

Primary Examiner—Leo P. Picard
Assistant Examiner—Cheryl R. Figlin
Attorney, Agent, or Firm—Wenderoth, Lind & Ponack

[57] ABSTRACT

In order to prevent the occurrence of corrosion due to the sliding of a relatively wide aluminum conductive layer (12) such as a power source conductive layer or a ground conductive layer, formed on a semiconductor substrate (11), breakage of a lower conductive layer due to the sliding of an upper aluminum conductive layer (12) in case of a multilayer interconnection, and the creation of voids in the lower aluminum conductive layer due to the moisture beneath the relatively wide metal conductive layer in case of a multi layer interconnection etc., the conductive layer structure is constructed so that the conductive layer (12) relatively great in width is divided into several conductive layer portions and so that the width of each of the divided conductive layer portions is in a range of 10 $\mu$m to 40 $\mu$m.

20 Claims, 12 Drawing Sheets

EM Life Tie Reduction Percentage (%)

$\dfrac{L - 2L'}{L} \times 100\ (\%)$

Percentage of Crack Occurrence (%)

Width L (μm) of Al Conductive Layer

STRUCTURE OF A SEMICONDUCTOR CHIP HAVING A CONDUCTIVE LAYER

TECHNICAL FIELD

The present invention relates to a structure of a semiconductor chip.

BACKGROUND OF THE INVENTION

Recently, it has become popular to package semiconductor devices such as, for example, IC or LSI devices using a resin instead of a ceramic material.

Conventionally, encapsulating a semiconductor chip by use of resin is performed by fixing, in a mold, a lead frame having the semiconductor chip mounted thereon and by flowing a sealing resin thereinto having a high temperature of approximately 170° C. When the resulting mold has been cooled down to a room temperature, since the silicon, which is a material constituting the chip, has a small thermal expansion coefficient and the sealing resin has a thermal expansion coefficient greater than that of silicon, the surface of the chip comes to receive a stress acting toward a center thereof due to shrinkage of the resin. As a result, a sliding phenomenon takes place in which an aluminum conductive layer having a large width, such as a high voltage power source conductive layer or a ground conductive layer, is forcibly biased toward the center of the chip. Such a phenomenon occurs also when cyclic temperature tests are performed.

To prevent the occurrence of the sliding phenomenon of the aluminum conductive layer, some countermeasures have been proposed in Japanese Laid Open Patent Nos. 62-111451, 62-174948 or 63-211648 which disclose that the aluminum conductive layer width is made narrow to constitute the conductive layers by a plurality of the narrower layer, or that the substantial width of the conductive layer is made small by providing a slit or slits in the layer, etc.

However, if the conductive layer or the ground conductive layer is made excessively small in width, electromigration will inconveniently occur. In addition, even if the aluminum conductive layer is divided into several parts, the effect of preventing the occurrence of the aluminum conductive layer sliding phenomenon will vanish if the divided conductive layer portion is made relatively large in width.

SUMMARY OF THE INVENTION

The present invention relates to a conductive layer structure of a semiconductor chip molded with an encapsulating resin, which has a relatively wide aluminum conductive layer divided into a plurality of narrower layer portions, and at least a part of which has a width of greater than 10 μm but smaller than 40 μm.

The present invention is directed to providing a multilayer conductive layer structure of a semiconductor chip having a portion of intersection between a lower conductive layer relatively small in width and an upper aluminum conductive layer relatively large in width, wherein the chip is molded with a sealing resin, the upper aluminum conductive layer is formed with a slit at a position spaced 10 μm to 50 μm from that side of the intersection portion between the lower conductive layer and the upper conductive layer which is located nearer to a center of the chip, and the position is in an extended region of a region formed through connection between the center of the chip and the side of the intersection portion.

Also, the present invention is directed to providing a conductive layer structure of a semiconductor chip having an intermediate insulating layer, capable of absorbing moisture, between the lower metal conductive layer and the upper metal conductive layer, the upper metal conductive layer being provided so that the width may be in a range of 10 μm to 40 μm at a position on the lower conductive layer.

BRIEF DESCRIPTION OF THE DRAWINGS

FIG. 12 is a view of the semiconductor chip illustrating a third embodiment in accordance with the present invention.

BEST MODE FOR CARRYING OUT THE INVENTION

First Embodiment

Figure 1:
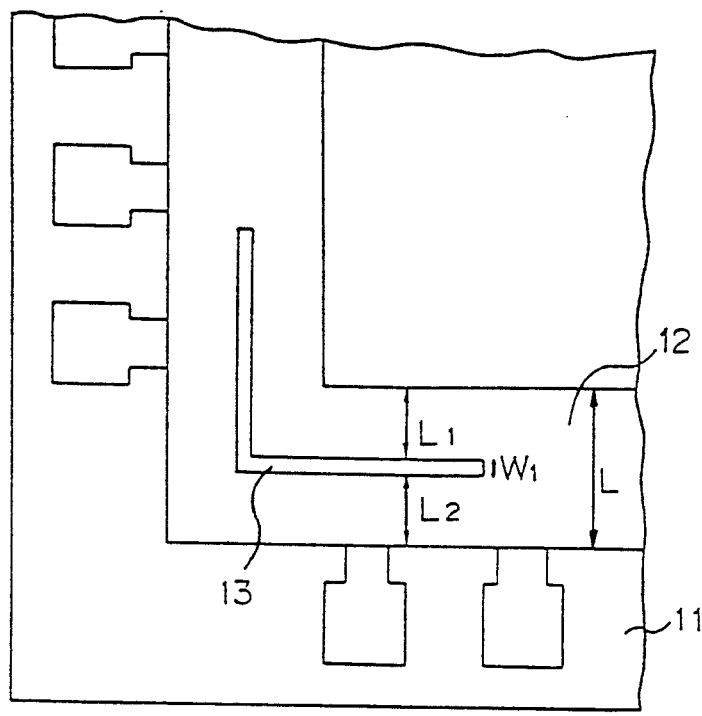
FIG. 1 is a partial plan view of a semiconductor chip illustrating a first embodiment in accordance with the present invention.

FIG. 1 is a partial plan view showing an angular portion of a semiconductor chip, the view being illustrated a first form of the embodiment in accordance with the present invention.

In the drawing, the semiconductor chip has a semiconductor substrate 11 on which there is formed a relatively wide aluminum conductive layer 12 as the power source conductive layer, i.e., a high voltage power source conductive layer or a ground conductive layer, a slit 13 being formed in this aluminum conductive layer 12 at a central part in a direction in which the conductive layer extends.

The slit 13 is so formed that the effective width of the aluminum conductive layer 12 having the slit therein may be greater than 90% of the width of the aluminum conductive layer having no slit therein. Namely, the width of this slit is made 10% or smaller of the width of the aluminum conductive layer formed with no slit.

Assume now that the width L of the aluminum conductive layer is 80 $\mu$m. Then, the slit is formed such that the width W1 may be 8 $\mu$m. In this connection, it is preferable to form the slit such that the widths L1 and L2 of the divided aluminum conductive layer portions may be 36 $\mu$m, respectively.

Figure 3A:
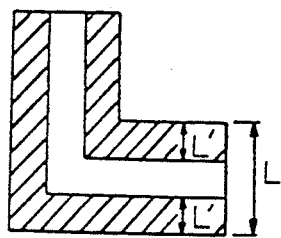
FIG. 3(a) is a partial plan view of a conductor layer having a slit.
Figure 3B:
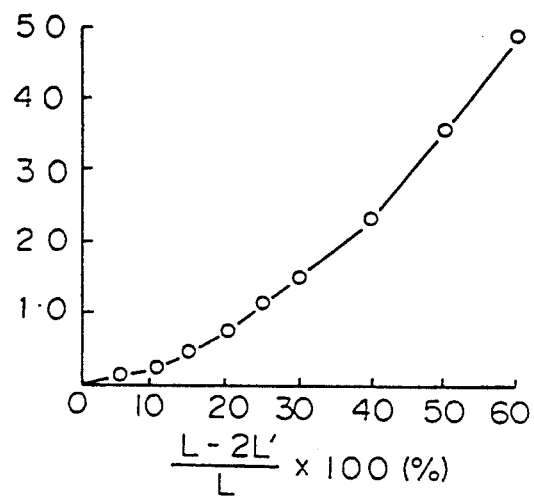
FIG. 3(b) is a graph showing the relationship between the proportion of area occupied in the conductive layer of FIG. 3(a) by a slit and the open percentage of the conductive layer due to electromigration phenomena.
Figure 4A:
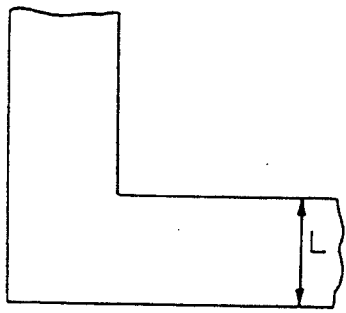
FIG. 4(a) is a partial plan view of an aluminum conductive layer.
Figure 4B:
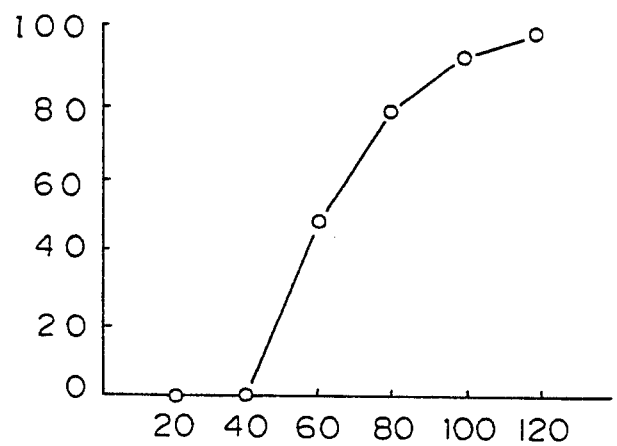
FIG. 4(b) is a graph showing the relationship between the width of the aluminum conductive layer of FIG. 4(a) and the percentage of crack generation in the passivation layer.

FIG. 3 is a view showing the relationship between the effective conductive layer-width percentage and the conductive layer degradation percentage due to electromigration of the aluminum conductive layer; and FIG. 4 is a view showing the relationship between the width of the aluminum conductive layer and the percentage in which cracks take place in the passivation layer formed on the aluminum conductive layer.

As shown in FIG. 3, the higher the effective conductive layer width percentage, the more the electromigration decreases. Preferably, where the effective conductive layer width percentage is higher than 90%, stabilization is achieved in a state of very small value. Further, as shown in FIG. 4, where the divided-conductive layer portion width at this time is smaller than 40 $\mu$m the aluminum sliding ceases to take place and the passivation crack does not take place.

In this way, if the slit is formed such that the effective width of the aluminum conductive layer having the slit therein may be greater than 90% of the aluminum conductive layer having no slit therein (so that the slit width may be smaller than 11% of the actual aluminum conductive layer width) and such that the width of each divided aluminum conductive layer portion may be smaller than 40 $\mu$m, the remaining life time of the aluminum conductive layer will not decrease and the sliding of the aluminum conductive layer will not take place, either.

Figure 2:
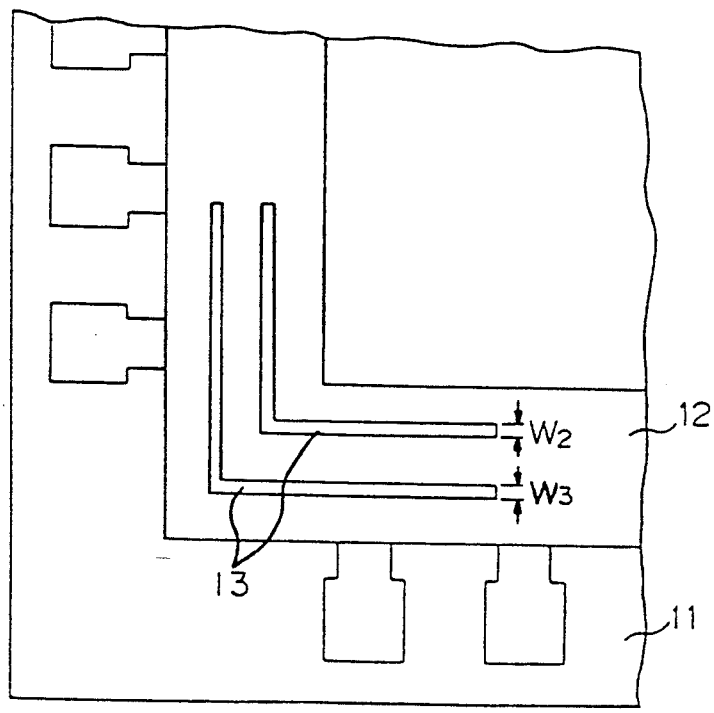
FIG. 2 is a partial plan view of a semiconductor chip illustrating another example of the first embodiment in accordance with the present invention.

FIG. 2 is a view showing a semiconductor chip in which two slits 13 respectively having widths W1 and W2 of 4 $\mu$m are formed in a conductive layer similar to the aluminum conductive layer shown in FIG. 1.

In this case as well, since the effective conductive layer width is greater than 90% of the original conductive layer width, the remaining life time of the conductive layer does not decrease and since, in addition, the conductive layer is divided into three portions by providing the two slits, each divided conductive layer portion width can be made not greater than 40 $\mu$m to prevent the occurrence of the aluminum conductive layer sliding phenomenon even in case the width thereof is further greater.

When forming L-shaped slits at angular portions of the aluminum conductive layer, the effect of preventing the occurrence of cracks in the passivation layer caused by the aluminum conductive layer becomes the greatest. It is thought that this is because the angular portions of the aluminum conductive layer usually are formed at angular portions of the semiconductor chip, and the position at which the former angular portions are provided is the remotest from the center of the chip and, hence, the pressure thereat which acts toward the chip center due to resin becomes the highest.

Meanwhile, the providing of the slits at the angular portions of the conductive layer leads to a reduction in width of the conductive layer and, in addition, to a change in the passing direction of current due to angular conductive layer portions, so that the current density there becomes locally high, whereby the remaining life time of the conductive layer may decrease due to migration.

Figure 5:
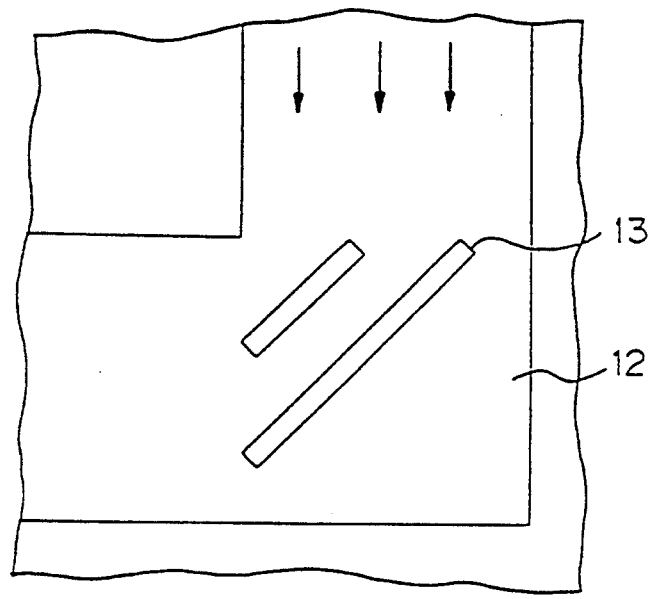
FIG. 5 is a plan view showing a preferred configuration of slits formed at a corner portion of the semiconductor chip.
Figure 6:
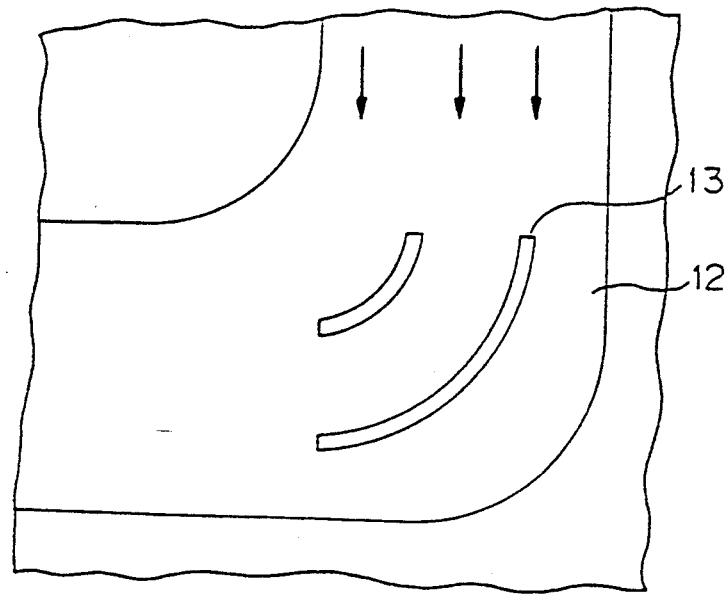
FIG. 6 is a plan view showing another preferred configuration of slits formed at a corner portion of the semiconductor chip.

When it is desired to avoid this, it is preferred that the slits 13 be formed in the conductive layer 12 in the form of straight lines inclined with respect to the flowing direction of current as shown in FIG. 5, or alternatively, that the slits 13 be formed in the conductive layer 12 so that the angle of inclination thereof with respect to the flowing direction of current may be gradually large with the slits being in the form of arcs as shown in FIG. 6, to relax the local concentration of current at the angular portions.

Second Embodiment

Figure 7:
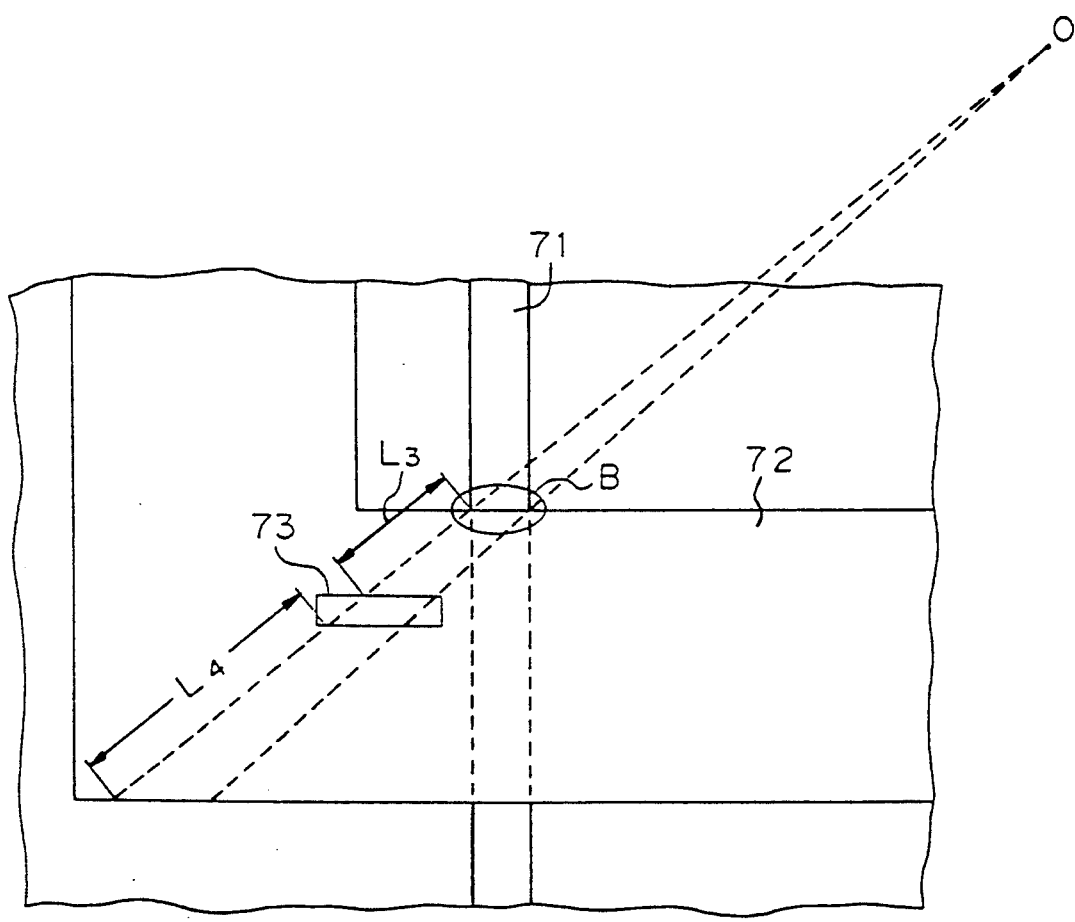
FIG. 7 is a partial plan view of the semiconductor chip illustrating a second embodiment in accordance with the present invention.
Figure 10A:
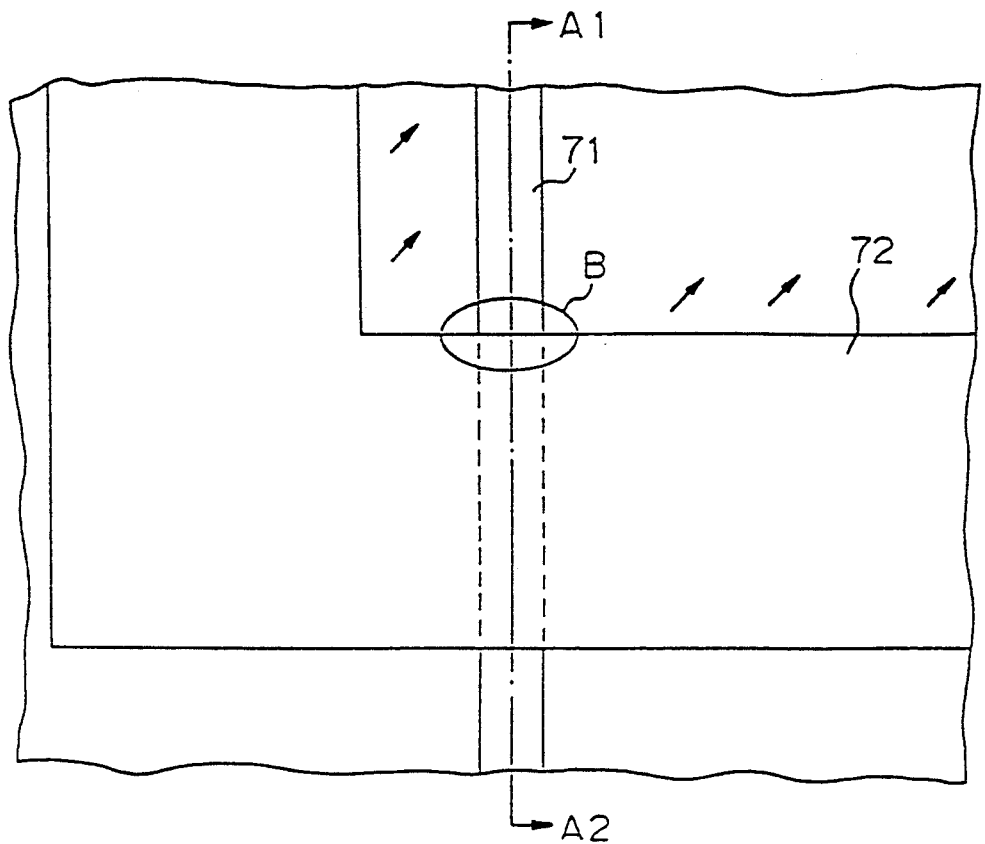
FIG. 10(a) being a plan view thereof and FIG. 10(b) being a sectional view taken along the line A1-A2 thereof.
Figure 10B:
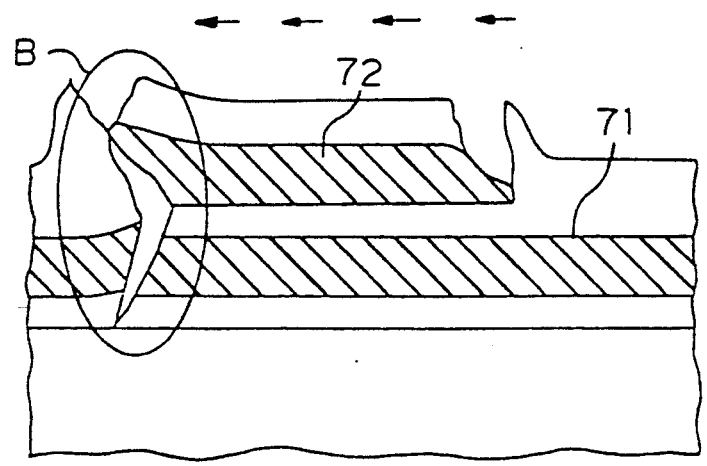
FIG. 10 is a view illustrating the principle in which breakage of the lower conductive layer occurs due to the sliding of the upper conductive layer.

FIG. 7 shows a conductive layer arrangement of a semiconductor chip illustrating the second embodiment in accordance with the present invention, and shows by way of example a corner portion of a semiconductor chip having a two-layer conductive layer arrangement wherein a relatively wide power source conductive layer 72 such as a high voltage conductive layer or a ground conductive layer is formed on a signal line layer 71 made of aluminum or polysilicon to which a clock signal or the like is applied.

Where such a relatively wide power source conductive layer, for example, is formed on this signal line layer 71, such a more serious problem as is shown in FIG. 10 arises due to the sliding of the aluminum conductive layer.

FIG. 10($a$) is a plan view in which the direction of stress acting on the conductive layer shown in FIG. 7 is indicated with use of arrows while, on the other hand, FIG. 10($b$) is a sectional view taken along the line A1-A2 of FIG. 10($a$).

When the power source conductive layer 72 is slided as in FIG. 10($b$) by receiving the stress acting toward the chip center, the stress of the power source conductive layer 72 is applied to the signal line 71, so that a defect, such as breakage of the signal line layer 71 or shortcircuiting between the power source conductive layer 72 and the signal line layer 71, occurs at a portion B in the drawing.

To avoid this defect, a slit 73 is formed at a extended region of a region formed through connection between the center O of the semiconductor chip and the boundary B, or end, of the overlap between the power source conductive layer 72 and the signal line layer 71. Namely, this slit 73 is formed in an extended region of a region which is formed from the chip center O to the inner end of the overlapping portion between the power source conductive layer 72 and the signal line layer 71. It should be noted here that where the width of the slit 73 at the side of the chip end is greater than 50 μm, it is necessary to form the slit 73 such that this slit may be prevented from reaching the signal line layer 71. Also, the distance L3 between the boundary B and the slit 73 preferably is set smaller than 50 μm as shown in FIG. 9.

Figure 9:
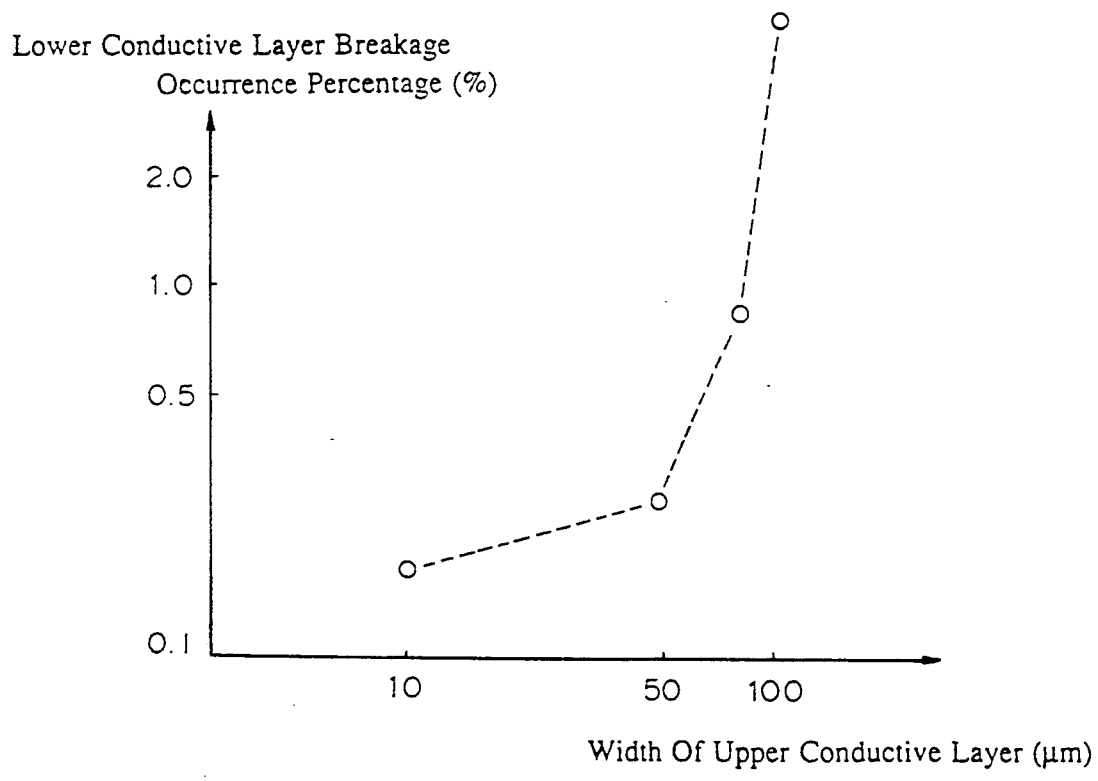
FIG. 9 is a graph showing the relationship between the width of the upper conductive layer and the percentage of occurrence of open failure of the lower conductive layer.

More specifically, FIG. 9 graphically shows the relationship between the width of the upper aluminum conductive layer and the breakage occurrence percentage of the lower conductive layer having a width of 2.5 μm. The condition in which the test was performed is a cyclic temperature test in which a temperature cycle of −65° C. (30 minutes)-room temperature (5 minutes) −150° C. (30 minutes) is repeated 855 times. As shown in the drawing, when the width of the upper conductive layer exceeds 50 μm, the breakage occurrence percentage of the lower conductive layer rapidly increases.

Accordingly, it is necessary that the distance L3 between the slit 73 and the boundary B between the signal line layer 71 as the lower conductive layer and the power source conductive layer 72 as the upper conductive layer be 50 μm or smaller. However, the distance L4 between the slit 73 and the end of the power source conductive layer 72 remote from the chip center O may exceed 50 μm. As a result, although there is a likelihood that cracks take place in the passivation layer at a region along an elongated side of the slit 73 remote from the center O of the semiconductor chip, the use of, for example, a chip coating of polyimide type would make it possible to lessen the entry of corrosive substance and hence to suppress the expansion of corrosion to a very small area or delay this expansion.

Additionally, where no use is made of any chip coating, there is a possibility that corrosion takes place due to sliding of the aluminum conductive layer, as previously explained in the first embodiment. To prevent this, it is necessary that the distance L4 be made 40 μm or less.

The reason why the slit 73 is formed on an extension of a straight line extended from the center of the semiconductor chip to the boundary B is that, since, as mentioned before, the stress of the sealing resin acts from outside of the chip toward the center thereof, provision of the slit in this path of stress acting would make it possible to prevent the occurrence of breakage at the boundary B. As a result, it is possible to selectively protect the boundary B between the lower conductive layer and the upper conductive layer.

Figure 11:
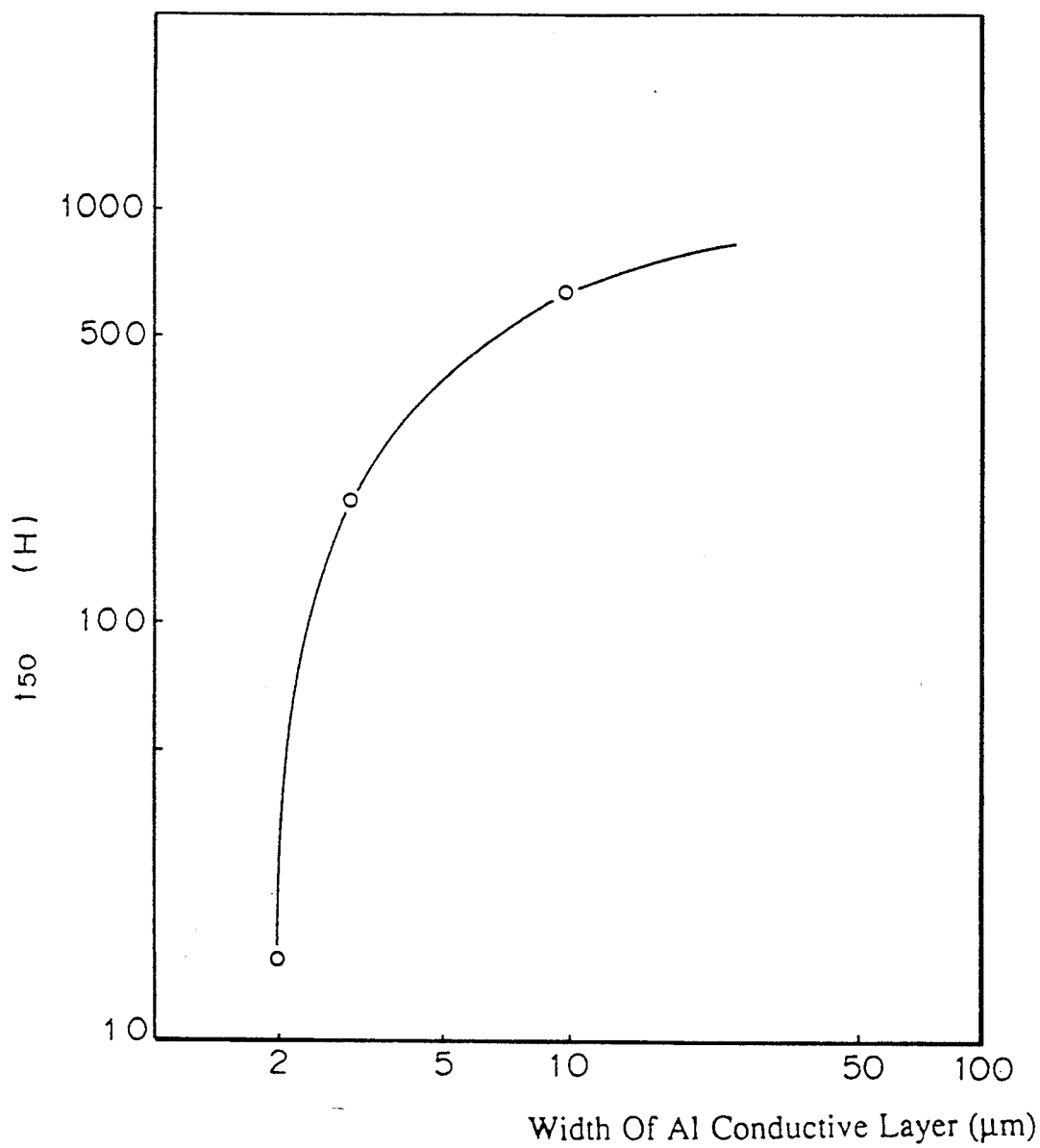
FIG. 11 is a bi-logarithmic graph showing the relationship between the width of the conductive layer and the conductive layer median open failure time period due to electromigration.

Preferably, the minimum distance L3 between the slit 73 and the boundary B between the signal line 71 and the power source conductive layer 72 is 10 μm or more as shown in FIG. 11.

Namely, FIG. 11 is a bi-logarithmic graph showing the relationship between the width of the aluminum conductive layer and the remaining life time of this aluminum conductive layer under the conditions that the current density is $2 \times 10^6$ A/cm$^2$; and the temperature is 200° C. In this graphic diagram, in a region where the width of the aluminum conductive layer is smaller than 10 μm, the conductive layer life time indicates a rapid decay. This is considered to be attributable to the occurrence of breakage resulting from the migration of the aluminum conductive layer.

Figure 8:
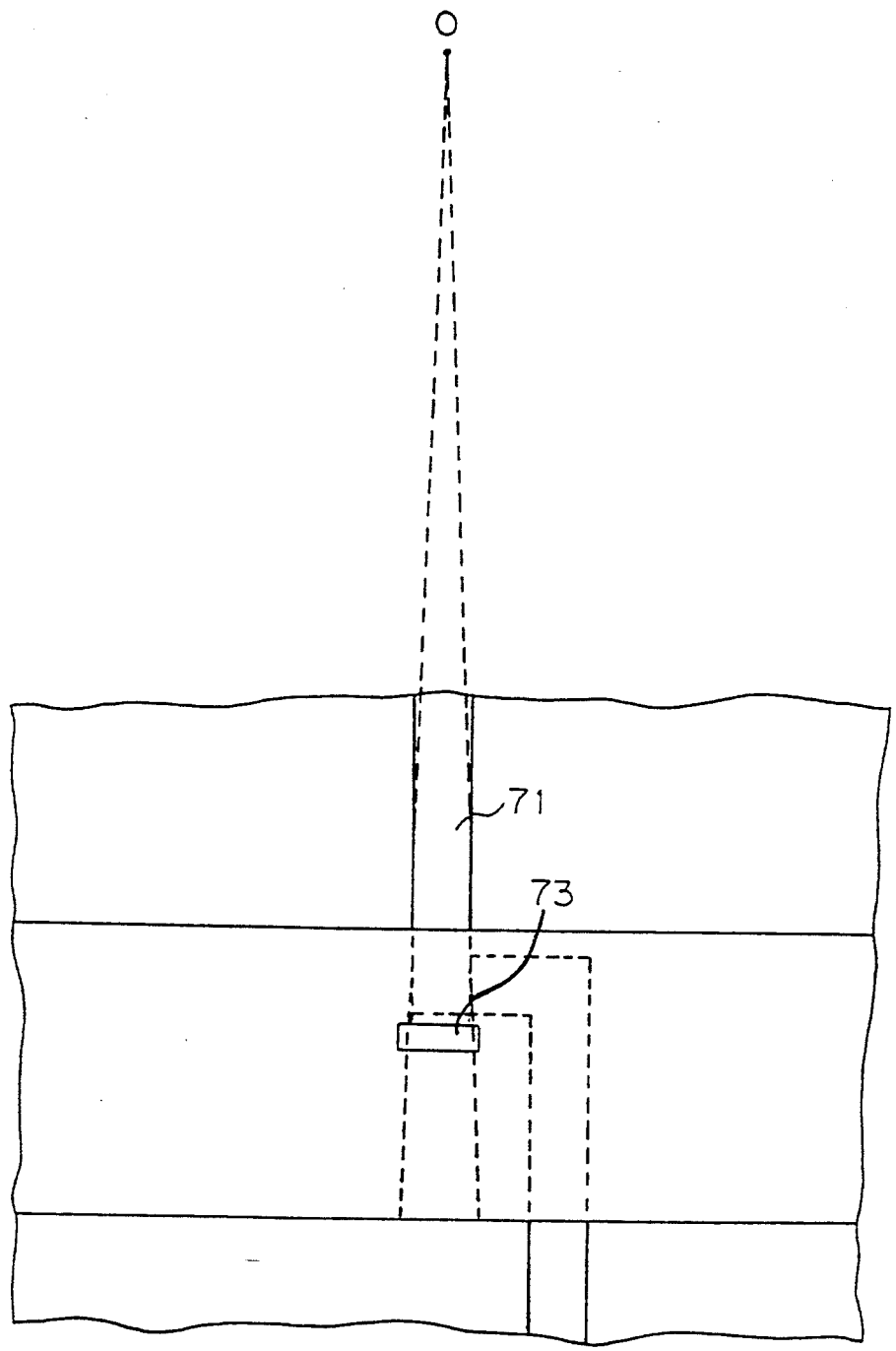
FIG. 8 is a partial plan view of the semiconductor chips illustrating another example of the second embodiment in accordance with the present invention.

Additionally, in case the conductive layer is provided in a portion of the semiconductor chip other than the corner portion thereof, it is preferred that the lower signal line layer 71 be bent so that this layer is out of contact with the slit 73, as shown in FIG. 8.

As described above, if the slit 73 is so formed as to make the power source conductive layer thin at the chip-center side, from the slit 73, of the extended region of a region extending from the center O of the semiconductor chip to the boundary B, or the end, of the overlapping portion between the power source conductive layer 72 and the signal line layer 71 and if the slit 73 is so formed as not to make the power source conductive layer thin at the opposite side, from the slit 73, of the extended region, then it would be possible to form the conductive layer without increasing the current concentration. Thus, it is possible to obtain a conductive layer which has a high resistance to migration.

Additionally, when it is desired to further prevent the current density increase due to concentration of current, measures can be taken of making thick the outer peripheral portion, at the side of the outer chip portion, of the power source conductive layer 72 by the extent of forming the slit.

The above description has been made, as an example, of a case where a power source conductive layer is formed as the upper conductive layer. However, the same applies to the case of forming a ground conductive layer as the upper conductive layer.

Third Embodiment

Figure 12A:
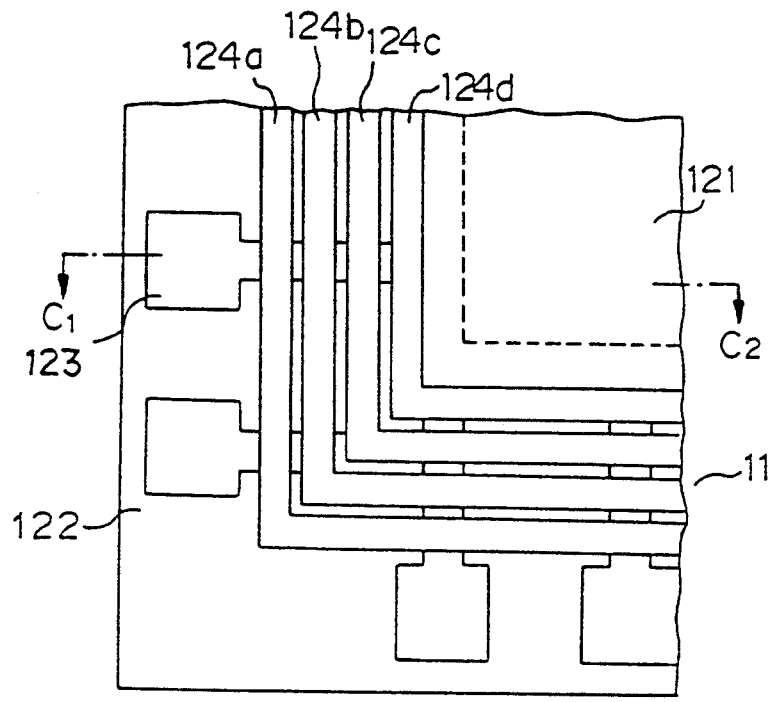
FIG. 12(a) being a partial plan view.
Figure 12B:
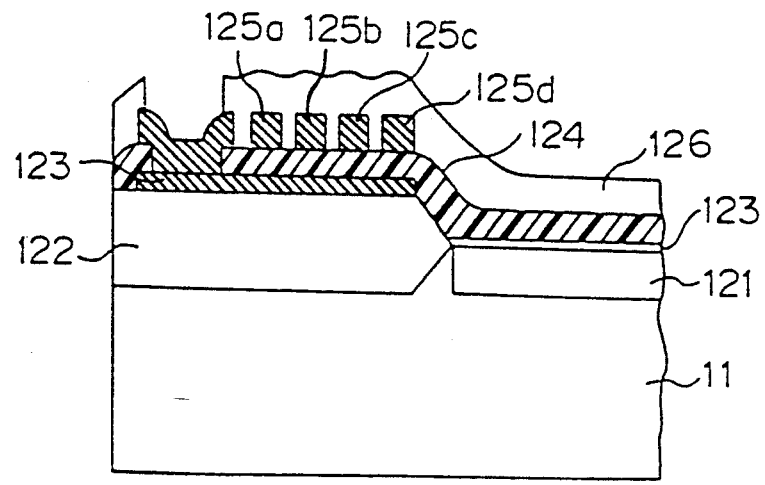
FIG. 12(b) being a partial sectional view.

FIG. 12(a) is a partial plan view showing an angular portion of a semiconductor chip illustrating a third embodiment in accordance with the present invention; FIG. 12(b) being a sectional view taken along the line (C1-C2) thereof.

Referring to FIGS. 12(a) and 12(b), an element region 121 and a field region 122 are formed on the substrate 11. A surface insulating layer and a first conductive layer are formed on the surface of the element region 121 and on the surface of the field region 122, respectively. An inter-layer insulating layer 124 such as a PSG, BPSG or SOG is formed on the surfaces of the insulating and conductive layers.

When a metal conductive layer such as a high voltage power source conductive layer or a ground conductive layer is formed on the inter-layer insulating layer 124 as a second conductive layer, the metal conductive layer is divided into a plurality of layer portions each having a small width from 10 μm to 30 μm. Where an aluminum condcutive layer is used as the power source conductive layer and is required to have a conductive layer width of 60 μm, the aluminum conductive layer is divided into four narrow-width aluminum conductive layer portions 125a, 125b, 125c and 125d each having a width of 15 μm. The space interval between two adjacent of the four conductive layer portions preferably is 4 μm. A passivation layer 126 is formed on the semiconductor chip including this aluminum conductive layer 125.

When the metal conductive layer is formed, by being divided as mentioned above, with respect to the semiconductor chip wherein the aluminum conductive layer, the intermediate layer and the metal conductive layer are formed in this order, a merit is obtained of improving the moisture-liberation characteristics.

Figure 13:
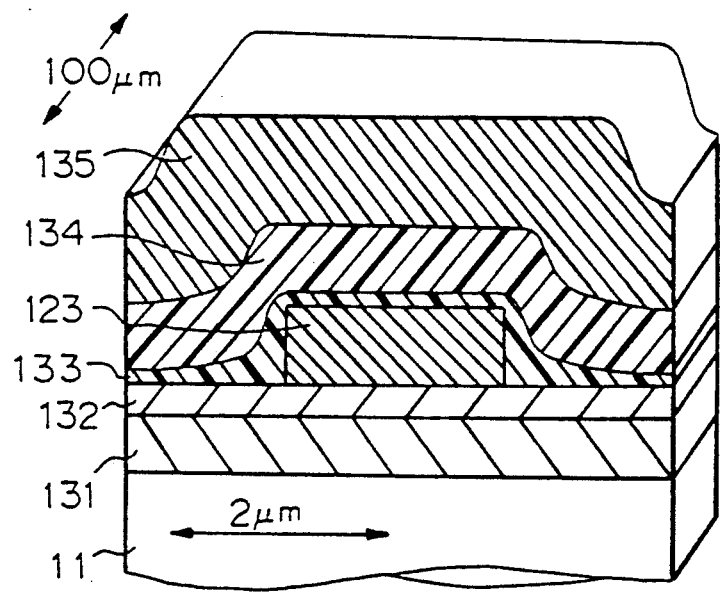
FIG. 13 is model view for illustrating moisture absorption layers.

FIG. 13 is a model view for illustrating the reasons therefor.

Figure 14:
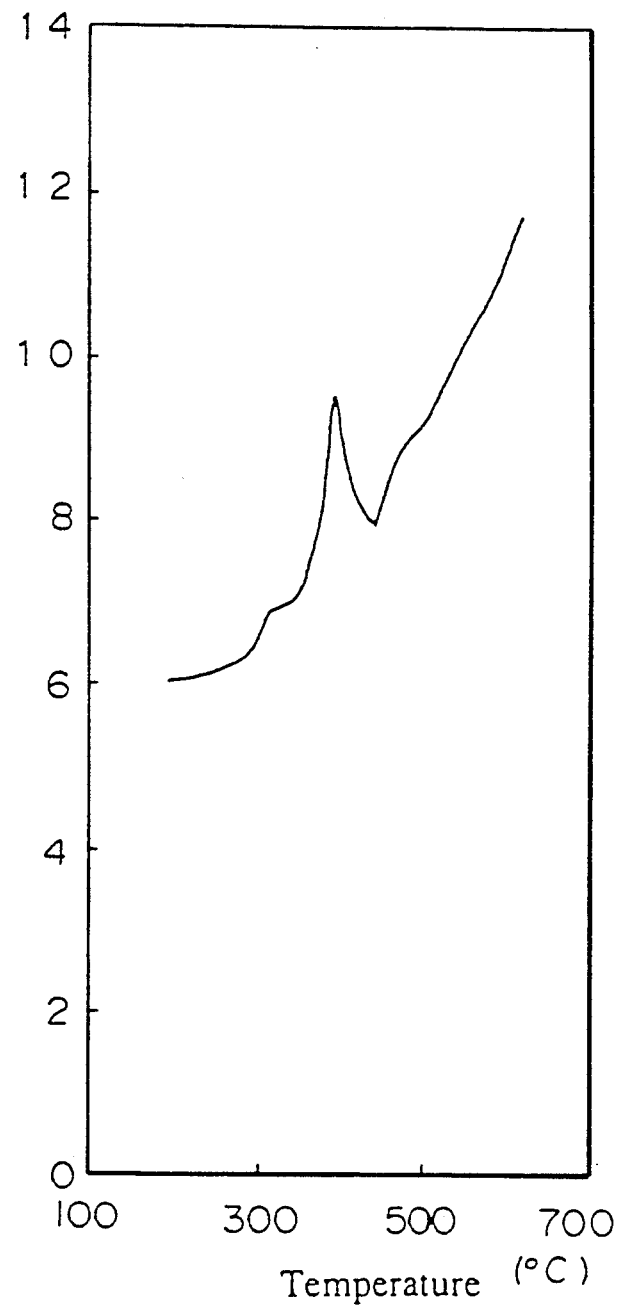
FIG. 14 is a graph showing the relationship between the temperature and the amount of moisture departing from the moisture absorption layer.

The drawing shows a state wherein a SiO layer 131 is formed on the silicon substrate 11; and on this SiO layer there are formed a BPSG layer 132, a first conductive layer 123, an SOG layer 133, a PSG layer 134 and a second conductive layer in the order mentioned. A passivation layer (not shown) is formed thereon. The PSG layer 134 contains moisture to some extent. The content of moisture in the SOG layer 133 is higher than that in the PSG layer 134, or several percent by weight of the layer 133. Although this moisture leaves, or goes away from, the layer interior with an increase in the temperature, the state of this departure has a characteristic peak in the vicinity of approximately 400° C. as shown in FIG. 14.

Figure 15:
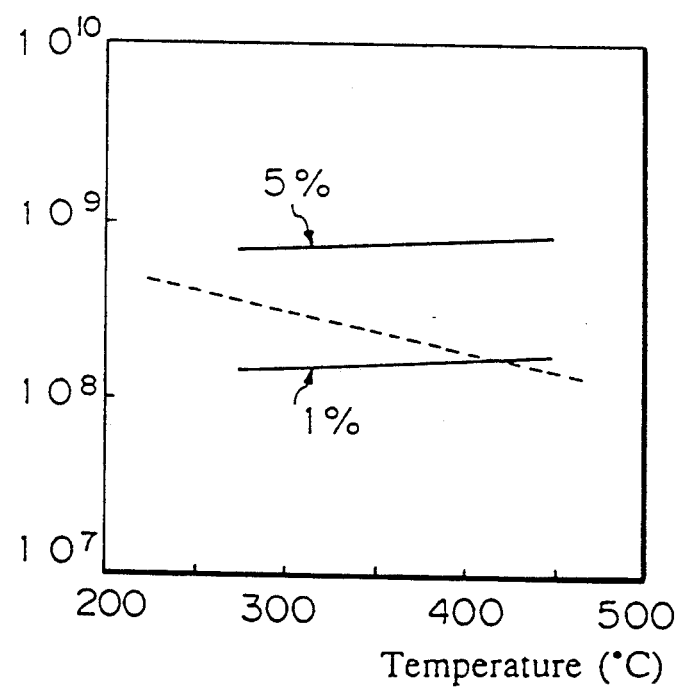
FIG. 15 is a graph showing the relationship between the temperature and the pressure among the aluminum conductive layers.

FIG. 15 is a graphic diagram showing, where the content of moisture in the SOG layer 133 sandwitched between the silicon substrate 11 and the second conductive layer 135 (100 $\mu$m in width) in FIG. 13 is 1 wt. % and 5 wt. %, the pressure in this region which has been calculated from a function of temperature as so represented and on the basis of an ideal gas model, provided, however, that the effective volume is assumed to be respective densities of SOG layer 133 and PSG layer and PSG layer 134 and the density of the thermal oxidation layer. In this graphic diagram, a broken line represents the yield stress of aluminum. From the diagram, it is seen that even where the content of moisture is 1 wt. %, the pressure exceeds the yield stress of the aluminum conductive layer at a sintering temperature (approximately 400° C.). This pressure becomes a stress which acts to forcibly spread the first conductive layer 123 into the surrounding region thereof to cause the creation of voids. Such pressure becomes a stress which destroys or breaks the passivation layer as well.

In this way, where the upper conductive layer is a metal conductive layer, the problems arise that voids are created and the passivation layer is destroyed. The problems similarly arise not only in use of aluminum but also in use of the other metals.

To avoid this, according to the present invention, the relatively wide upper aluminum conductive layer is divided into a plurality of aluminum conductive layer portions each having a width narrower than the original aluminum conductive layer. By so doing, escaping of the moisture in the interlayer insulating layer 124 is effected from the gaps each of 4 $\mu$m between the divided aluminum conductive layer portions. By allowing the moisture to escape from the gaps, it is possible to reduce the level of the pressure acting on the underside of the first conductive layer, and thereby preventing any void from being created in the lower metal conductive layer. Preferably, the width of the divided conductive layer portions is 40 $\mu$m or below.

Incidentally, for allowing the moisture to escape, openings, in place of the slit, may be provided in the upper aluminum conductive layer at space intervals each of from 10 $\mu$m to 40 $\mu$m.

INDUSTRIAL UTILIZABILITY

In the first embodiment of the present invention, it is possible to obtain a conductive layer structure which is capable of preventing the sliding of the aluminum conductive layer and thereby preventing the remaining life time of the conductive layer from being decreased due to the electromigration which would otherwise occur.

In the second embodiment of the present invention, local pattern shifting of the power source conductive layer is eliminated so as to prevent the occurrence of breakage of the lower conductive layer due to such pattern shifting. Also, since the slender ground conductive layer portions can be lessened to a maximum extent, these upper conductive layer portions can be prevented from being broken due to migration. Also, since the slits have been provided at the specified portions, ineffective regions of the high-order power source conductive layer or the ground conductive layer are lessened very much, with the result that the area occupied by the layer of this conductive layer is not enlarged. Thus, it is also possible to make small the area of the semiconductor chip.

In the third embodiment of the present invention, escaping of the moisture in the inter-layer insulating layer can be made easily, creating of any voids in the lower aluminum conductive layer can be prevented, and occurrence of any crack in the passivation layer can also be prevented.

We claim:

1. A conductive layer structure of a semiconductor integrated circuit device comprising:
    a semiconductor substrate having a major surface:
    a metal conductive layer formed on the major surface of said semiconductor substrate, said metal conductive layer including a wiring line extending lengthwise in a first direction and widthwise in a second direction substantially perpendicular to the first direction,
    the wiring line including a slit having a width in the second direction, the slit dividing the wiring line widthwise into a plurality of wiring line parts each of which having a width in the second direction which is smaller than about 40 $\mu$m, the width of the slit being not greater than 10% of the width of the wiring line; and
    a passivation film formed on said metal conductive layer.

2. A conductive layer structure according to claim 1, wherein said metal conductive layer is made of aluminum.

3. A conductive layer structure according to claim 1, wherein said metal conductive layer is made of aluminum alloy.

4. A conductive layer structure according to claim 1, wherein the metal wiring line supplies a power source potential.

5. A conductive layer structure according to claim 1, wherein the metal wiring line supplies a ground level potential.

6. A conductive layer structure of a semiconductor integrated circuit device comprising:
    a semiconductor substrate having a major surface, said semiconductor substrate having a center point of the major surface;
    a lower conductive layer formed on the major surface of said semiconductor substrate, said lower conductive layer including a first wiring line extending lengthwise in a first direction and widthwise in a second direction substantially perpendicular to the first direction;
    an insulating layer formed on said lower conductive layer;
    an upper metal conductive layer formed on said insulating layer, said upper metal conductive layer including a second wiring line extending lengthwise in the second direction and widthwise in the first direction, the width of the second wiring line being larger than the width of the first wiring line, the first and second wiring lines intersecting at a crossing area which has an inner boundary extending in the second direction, the second wiring line having a slit which is located at a region where a straight line passing through the center point of said semiconductor substrate and the inner boundary of the crossing area of the first and second wiring lines is passed, the slit being not located in the crossing area of the first and second wiring lines; and a passivation film formed on said upper metal conductive layer.

7. A conductive layer structure according to claim 6, wherein a distance from the inner boundary of the crossing area of the first and second wiring lines to the slit along the straight line passing through the center point of said semiconductor substrate and the inner boundary of the crossing area of the first and second wiring lines is in the range of about 10 μm to 50 μm.

8. A conductive layer structure according to claim 6, wherein the slit is located more than 50 μm inside from a side of said silicon substrate.

9. A conductive layer structure according to claim 6, wherein said upper metal conductive layer is made of aluminum.

10. A conductive layer structure according to claim 6, wherein said upper metal conductive layer is made of aluminum alloy.

11. A conductive layer structure according to claim 6, wherein said lower conductive layer is made of polycrystalline silicone.

12. A conductive layer structure according to claim 6, wherein the second wiring line supplies a power potential.

13. A conductive layer structure according to claim 6, wherein the second wiring line supplies a ground level potential.

14. A conductive layer structure according to claim 6, wherein the first wiring line supplies a clock signal.

15. A conductive layer structure of a semiconductor integrated circuit device comprising:

a semiconductor substrate having a major surface;

a lower conductive layer formed on the major surface of said semiconductor substrate, said lower conductive layer including a first wiring line extending lengthwise in a first direction;

an insulating layer formed on said lower conductive layer;

an upper metal conductive layer formed on said insulating layer, said upper metal conductive layer including a plurality of second wiring lines extending lengthwise in a second direction substantially perpendicular to the first direction, the second wiring lines being arranged in parallel to each other and each having a width in the first direction smaller than about 40 μm, the second wiring lines receiving a same signal; and a passivation film formed on said upper metal conductive layer.

16. A conductive layer structure according to claim 15, wherein said upper metal conductive layer is made of aluminum.

17. A conductive layer structure according to claim 15, wherein said upper metal conductive layer is made of aluminum alloy.

18. A conductive layer structure according to claim 15, wherein said lower conductive layer is made of polycrystalline silicon.

19. A conductive layer structure according to claim 15, wherein the second wiring lines receive a signal having a power source potential.

20. A conductive layer structure according to claim 15, wherein the second wiring lines receive a signal having a ground level potential.

* * * * *